United States Patent [19]
Eisenstein et al.

[11] Patent Number: 4,939,474
[45] Date of Patent: Jul. 3, 1990

[54] SEMICONDUCTOR OPTICAL AMPLIFIER WITH SHORTENED GAIN RECOVERY TIME

[75] Inventors: Gadi Eisenstein, Middletown; Per B. Hansen, Shrewsbury; Rodney S. Tucker, Freehold; Jay M. Wiesenfeld, Lincroft, all of N.J.

[73] Assignee: AT&T Bell Laboratories, Murray Hill, N.J.

[21] Appl. No.: 431,693

[22] Filed: Nov. 3, 1989

Related U.S. Application Data

[63] Continuation of Ser. No. 237,252, Aug. 26, 1988, abandoned.

[51] Int. Cl.$^5$ ............................................. H01S 3/19
[52] U.S. Cl. .................................... 330/4.3; 455/611; 372/43
[58] Field of Search .............. 330/4.3, 4.9; 455/609, 455/611; 357/30 D, 30 F, 30 L; 372/43–45, 20, 82, 33

[56] References Cited

U.S. PATENT DOCUMENTS

| | | | |
|---|---|---|---|
| 4,454,526 | 6/1984 | Nishizawa et al. | 357/31 |
| 4,589,115 | 5/1986 | Burnham et al. | 372/45 |
| 4,689,797 | 8/1987 | Olshansky | 372/45 |
| 4,727,555 | 2/1988 | Burnham et al. | 372/20 |
| 4,769,687 | 9/1988 | Nakuzato et al. | 357/44 |
| 4,794,346 | 12/1988 | Miller | 330/4.3 |
| 4,835,779 | 5/1989 | Liou | 372/46 |

FOREIGN PATENT DOCUMENTS 287332  4/1988  European Pat. Off. .

OTHER PUBLICATIONS

Camras et al, "Photopumped Low Threshold . . . Lasers", Appl. Phys. Lett., vol. 42, #9, pp. 761–763, 5/1/83, abst.
Eisenstein et al, "Amplification of High . . . Amplifier", Appl. Phys. Lett., vol. 53, #16, pp. 1539–1541, 10/17/88, abst.
Neugroshel et al, "Evidence For Excess Charge Carrier . . . ", IEEE Electron Device Lett., vol. EDL-6, #5, pp. 253–255, 5/85, abst.
Marshall, I. W. et al., Electron. Lett. vol. 23, p. 818 (1987).
Stix, M. S., et al., Appl. Phys. Lett. vol. 48, p. 1722 (1986).
Kesler, M. P. et al., Appl. Phys. Lett. vol. 51, p. 1765 (1987).
Bessenov, Y. L., et al., Sov. J. Quantum Electron., vol. 12, p. 1510 (1982).
Taylor, A. J., et al., Phys. Rev. B, vol. 35, p. 2321 (1987).
Sermage, B. et al., J. App. Phys., vol. 57, p. 5443, (1985).
Eisenstein, G., et al., IEEE J. Lightwave Tech., LT-6, vol. 12, (1988).
Tucker, R. S., et al., IEEE J. Lightwave Tech., LT-3, p. 1180, (1985).

*Primary Examiner*—Nelson Moskowitz
*Attorney, Agent, or Firm*—Samuel H. Dworetsky

[57] ABSTRACT

An improved semiconductor optical amplifier with shortened gain-recovery time is disclosed. In the inventive device a carrier-storage region is placed adjacent to the gain region of the amplifier. Passage of carriers from the storage region to the gain region rapidly replenishes the carrier population within the gain region, thereby permitting rapid recovery of the amplifier gain.

4 Claims, 9 Drawing Sheets

FIG. 5 CROSS SECTION OF CSBH

4,939,474

SEMICONDUCTOR OPTICAL AMPLIFIER WITH SHORTENED GAIN RECOVERY TIME

This application is a continuation application Ser. No. 237,252, filed on August 26, 1988, now abandoned.

TECHNICAL FIELD

This invention involves semiconductor optical amplifiers and optical communication systems including such amplifiers.

BACKGROUND OF THE INVENTION

The availability of low-cost, low-loss optical fibers has stimulated a veritable revolution in the field of optical communications. Optical transmission has already been realized commercially and such transmission lines now span continents and oceans. Researchers are now blazing the way for the next step in this revolution—the use integrated optical circuits to process information-bearing optical signals. Presently, signals are processed in electrical form, and are transformed to optical form only for the purposes of transmission. Clearly, significant economic advantages will accrue when such signals can be processed while still in optical form, thereby avoiding the need to transform the signals back and forth from electrical to optical form.

The processing of optical signals will necessitate the use of many complex devices such as lasers, detectors, modulators, amplifiers, regenerators, etc. However, commercial use will be realized only when the fabrication of these devices is rendered economically viable through the use of integration techniques, with more than one device fabricated on a single chip. Accordingly, significant research and development effort has been expended exploring the design and manufacture of such integrated semiconductor devices. This application relates to at least one such device—the optical amplifier. (The term optical as used here is meant to include a broader region of the spectrum than simply the visible region. The term is rather related to the developing field of optical communications, and, accordingly, refers to any radiation which can be transmitted through a dielectric medium, usually an optical fiber, with a loss less than 2 dB/km or even 1 dB/km. Currently such radiation extends from approximately 0.5 microns to 20 microns. However, this region may be greater and may be extended in the future. In such event, the term optical is meant to include such an extended region of the electromagnetic spectrum.)

An optical amplifier is a device which receives an optical signal and amplifies it—preferably with minimal distortion or other alteration. Current efforts often involve semiconductor laser structures which are altered, at least to the extent that the laser reflecting surface is treated with an antireflection coating. In such devices the product of the gain and the reflectivity is less than one so that the device does not oscillate. Rather, the device is used to amplify an incoming optical as it passes through the device. Such devices are usually called traveling wave amplifiers, connoting the fact that the optical signal does not pass back and forth within the device, but merely passes through it essentially only once.

A critical consideration in the design of such optical amplifiers involves the stability of the amplifier gain. Clearly any variation in the gain of the amplifier will result in distortion of the signal upon amplification. However, the amplification mechanism, which is relied upon in such devices, may introduce an inherent variation in the device gain. This can be understood by recalling that such devices rely upon the phenomenon of stimulated emission to provide the necessary amplification. Stimulated emission, in turn, requires the establishment of a population inversion, which is depleted every time an optical signal passes through the amplifier, and which is reestablished only over some finite period of time. (In typical semiconductor amplifiers or lasers a population inversion is evidenced by the presence of a specified carrier density.) Consequently, the gain of the amplifier will be reduced for some period of time following the passage of any signal through the amplifier—a time period commonly denoted "the amplifier gain-recovery time".

SUMMARY OF THE INVENTION

This invention is an improved semiconductor optical amplifier with a shortened gain-recovery time. The recovery time of the inventive amplifier is sufficiently short to permit its effective use in optical communications systems involving data bit-streams with associated data bi-rates greater than 1 GHz, and often greater than 2 or even 3 GHz. This invention arises from our improved understanding of the mechanism which accounts for the restoration of the carrier density following its depletion due to the passage of an optical signal through the amplifier. The restoration of the carrier density is normally intolerably slow, and therefore results in an intolerably long gain-recovery time. We have found that the restoration of the carrier density, and therefore the gain-recovery time, can be significantly shortened by juxtaposition at least one carrier-storage region adjacent to the gain region of the amplifier. Passage of carriers from the storage region to the gain region can rapidly replenish the carrier population within the gain region, and thereby permit recovery of the amplifier gain.

DETAILED DESCRIPTION

I. Introduction

The invention is an optical amplifier with a shortened gain recovery time, and an optical communications system which includes such an improved amplifier. The invention will be more readily appreciated after some introduction to the lasing and optical amplification phenomena as it occurs in semiconductor materials. The lasing phenomenon, and the optical amplification phenomenon as it is most commonly effected in semiconductor materials, rely on the known physical mechanisms of population inversion and stimulated emission. Both lasing and amplification depend on the stimulated transition of a physical system from an inverted, excited state to a lower, less excited state. A population inversion occurs, prior to the lasing or amplification phenomenon, when there exist more upper excited states than lower states. Such a population inversion is effected by appropriately energizing the system. In the case of semiconductor lasers or amplifiers, an excited state may be visualized as one in which there exists an electron in the conduction band and a concomitant hole in the valence band. A transition from such an excited state, to a lower state in which neither an electron nor a hole exist, results in the creation of a photon.

Figure 10:
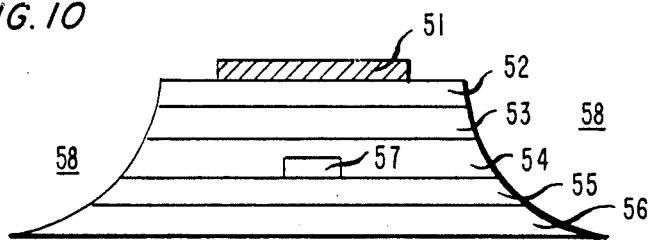
FIG. 10 is an alternative embodiment of the invention involving a ridge waveguide amplifier.

These properties of the semiconductor may be used to fabricate either a laser or an optical amplifier. Such devices are shown schematically in the single generic structure of FIG. 1 which is not drawn to scale and which does not show many of the device elements that are unnecessary for the purposes of this discussion. In this FIG. 10 is the "gain region" where the excitation and the stimulated emission processes occur. The material which comprises the gain region may be any material in which an appropriate inversion, and concomitant stimulated emission, may occur. Most often such materials will be direct band gap materials which are characterized by the fact that in such materials the maximum energy state of the valence band and the minimum energy state of the conduction band, occur at the same position in momentum space. Accordingly, in such systems there exists allowed optical transitions between the valence and conduction bands that require no phonon for momentum conservation. The gain region provides optical gain in response to injecting carriers into the conduction band, for example, by means of an appropriate electrical bias, or through the use of appropriate optically stimulated phenomena which result in the creation of such carriers. However, for convenience this application is written in terms of the electrical means for generating carriers, and accordingly reference will be made to a "current" or a "carrier injecting current" which flows through the device to inject carriers. However, it will be understood that by such term we include optical beams or other means for generating carriers.

Figure 1:
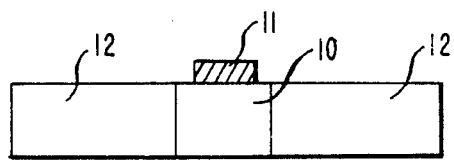
FIG. 1 is a schematic representation of the inventive optical amplifier.

In the FIG. 1, 11, is a means for "limiting" the optical field to the gain region. Such limitation may be effected, for example, by a region of differing index of refraction, as shown by the exemplary ridge waveguide structure which "loads" the underlined gain region. Such "limitation" of the optical field below the ridge waveguide confines the field in a direction transverse to its direction of travel, and to a degree in excess of that which obtains when only difraction effects are considered. The ridge, 11, is shown to be narrower in extent of the underlying gain region 10, however, specific embodiments may involve ridges or other means for limiting the optical field to the gain region, may be greater than or equal to the underlying gain region in the perspective shown in FIG. 1. An apropriate optical cavity with axis perpendicular to the plane of FIG. 1 is formed in the region underlying the ridge 11 by appropriate reflecting surfaces and is used as a feedback device when the structure of FIG. 1 is operated as a laser. However, when the structure is operated as an amplifier, feedback is not desirable since without feedback gain greater than that necessary to oscillate can be obtained. Accordingly, laser structures may be operated as amplifiers by reducing the reflectivity of one or more cavity surfaces. This is usually effected by coating the surfaces perpendicular to the direction of propagation of the optical field ("end surfaces") with an antireflection coating so that light passing through the cavity does not reflect off the cavity surfaces but rather exists after only a single pass. Such devices are sometimes called traveling-wave amplifiers. An alternative technique for reducing the end surface reflectivity of the device involves fabricating the laser structure so that the direction of propagation of the optical radiation is not perpendicular to the end surface. In such devices, the end surfaces may additionally be coated with an antireflection coating for improved performance.

In FIG. 1, region 12 is often a "blocking" region which limits the exemplary carrier injection current to the gain region. In many embodiments this region may simply be a reversed biased pn junction. The critical significance of this region to our invention will be more readily appreciated by considering the effect of parasitic capacitance associated with this region of the operation of the device as a laser. When operated as a laser, the device will likely have no optical input. In order to pulse the laser so as to obtain an information-bearing optical output the bias voltage, and the associated current, will be varied rapidly. Any parasitic capacitance associated with the "blocking" region, 12, will effectively limit the speed at which the laser can be pulsed, and consequently the bit-rate of the device, and the associated optical communication system. Consequently, such lasers are designed to have minimal parasitic capacities.

However, in a discovery critical to this invention, we have found that when the device is operated as an optical amplifier such parasitic capacitance and other carrier-storage effect are beneficial. This can be understood by considering the details of the amplifier operation. When operated as an amplifier the device has associated with it an optical input which results in stimulated emission and consequent amplification. A constant bias, rather than the pulse bias used in laser operation, ensures a constantly inverted population of excited states. However, when the optical pulses entering the amplifier are closely spaced, the temporary depletion of excited states, which occurs as a result of the stimulated emission, cannot be replenished rapidly enough to result in a sufficiently inverted population before the arrival of the next optical pulse. Consequently, the second optical pulse will not be amplified to the same degree as the first optical pulse. The amplification of the second pulse is therefore dependent on the amplitude of the first optical pulse. In a data-encoded information-bearing optical data stream, this effect will lead to signal distortion in the form of inter-symbol interference.

However, if the "blocking" region 12 has an associated large capacitance, this region may act as a "carrier-storage" region, and will replenish the gain region with carriers, thereby more rapidly returning the gain region to a condition of inverted population so that amplification of each pulse is largely uneffected by the amplitude of the preceding pulse or pulses and inter-symbol interference is therefore reduced. The inventive device therefore involves a carrier-storage region or reservoir juxtaposed sufficiently close to the gain region so that the carriers can rapidly replenish those depleted when a pulse is amplified. Accordingly, the device will be designed so that the time for carriers to move from the storage region to the gain region would normally be less than or equal to the intrinsic lifetime of the carriers in the gain region. Such movement may occur, for example, as a result of drift of the carriers under the influence of an applied electrical field or of diffusion due to a carrier density gradient. This carrier density gradient is established as a result of the fact that the optical signal is confined substantially to the gain region and therefore depletes the carries primarily in the gain region leaving the carrier density in the storage region substantially unaffected. Consequently, immediately after passage of the optical signal through he gain region, a carrier density gradient is established between the storage region and the gain region causing a diffusion of carriers from the storage region to the gain region. An aspect of the invention involves the juxtaposition of the storage region sufficiently close to the gain region so that the diffusion time under the influence of the carrier density gradient is sufficiently rapid to replenish the carrier density within the gain region more rapidly than would occur in the absence of such juxtaposition of the storage region, all other variables being considered equal.

In order to distinguish our invention from any possible inadvertent prior art investigation involving lasers and/or amplifiers, we have discussed our invention in the context of the amplification of "information-bearing" optical signals or optical signals "representative of intelligence". By these terms we mean to describe optical signals which are purposefully formed so as to represent information and/or intelligence, thereby distinguishing our invention from possible anadvertent use of lasers and/or amplifiers without either recognizing or taking advantage of the properties of the inventive amplifiers disclosed here.

II. ANALYSIS OF THE GAIN RECOVERY TIME IN THE INVENTIVE AMPLIFIER

In this section we discuss the major issue relating to the inventive amplifier—gain compression and its associated recovery. We will discuss our observations of gain compression and gain recovery, as well as our observations of gain recovery in various structures including embodiments of the inventive structure.

In a digital data stream, the separation between pulses can be any integer multiple of the bit period. If an input pulse has sufficient energy to compress the gain, and if the bit period is shorter than the amplifier gain recovery time, then the amplifier can cause inter-symbol interference since the gain experienced by a given pulse will depend on the time interval from the previous pulse, which is random. Gain compression and recovery processes therefore limit the maximum allowed bit-rate and amplifier input power level for which digital signals can be amplified without inter-symbol interference. Evidence of different gains for different bits of a pseuderandom bit stream at 2 Gb/s has been reported in a 1.55—$\mu$m amplifier. (I. W. Marshall, D. M. Spirit and M. J. O'Mahony, Electron. Lett. 23,818, 1987) Gain compression and recovery in AlGaAs lasers have been previously studied with sub-picosecond temporal resolution. (M. S. Stix, M. P. Kesler and E. P. Ippen, Appl. Phys. Lett. 48, 1722 (1986) and M. P. Kesler and E. P. Ippen, Appl. Lett. 51, 1765 (1987)) We analyzed the phenomena of gain compression and associated recovery using the experimental apparatus shown in FIG. 2. As shown in that figure, a sinusoidal clock signal drives two wavelength-tunable mode-locked semiconductor lasers. (Y. L. Bessenov, A. P. Bogatov. P. P. Vasil'ev, V. N. Morozov and A. B. Sergeev, Sov. J. Quantum Electron., 12, 1510 (1983)) The lasers use external-cavity resonators with grating end-reflectors. The grating controls the operating wavelength and the spectral width of the laser. The lasers can be mode-locked either at their fundamental resonance frequency of 1 GHz or at higher harmonics. Pulse durations are 12–25 ps FWHM. The narrowest pulses are generated in the wavelength range of 1.24–1.25 $\mu$m. A microwave phase shifter, inserted in the RF signal path of one of the lasers, is used to vary the delay between the two optical pulse trains. The two pulse trains are combined in a fiber directional coupler. A second directional coupler is inserted in the optical signal path to provide an additional diagnostic port. The polarization states of the two pulse trains are adjusted, using fiber polarization controllers. Light is coupled into an InGaAsP 1.3 $\mu$m TW amplifier under test using a microlens, and is coupled out using a microscope objective. Input and output coupling losses are 4 dB and 5–6 dB, respectively. The pulse width, delay between pulses and the optical spectra are measured both before and after the amplifier using, respectively, a streak camera with a resolution of 8 ps and an optical spectrum analyzer with a resolution of 0.1 nm. Gain is measured by chopping the probe signal and comparing the signals on two Ge photodetectors: one at the output and one which monitors the power in the input fiber.

The TW amplifier used in the present experiment was obtained by deposition antireflection coatings on the two facets of a nominally 1.3—$\mu$m, 250 $\mu$m long, channel substrate buried heterostructure laser chip. The mean facet reflectivity was $3 \times 10$. (I. W. Marshall, D. M. Spirit and M. J. O'Mahony, Electron. Lett. 23, 818, 1987). The device gain at the wavelength of 1.25 $\mu$m, where the picosecond pulse amplification experiments were performed, was $20 \pm 0.5$ dB.

Figure 3:
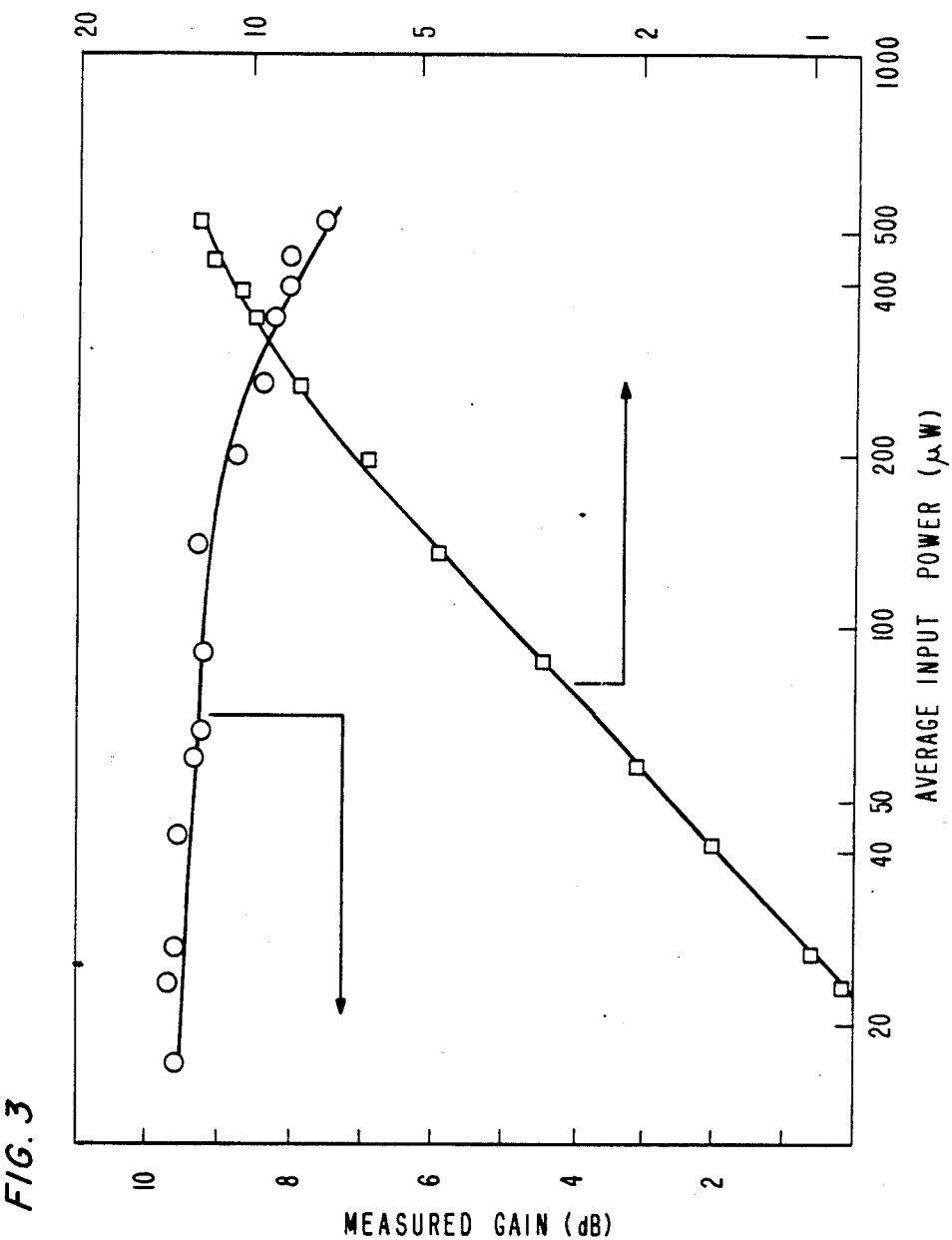
FIG. 3 shows the gain and output power of an optical amplifier as a function of average input power (as measured in the input fiber) for a 12-ps 4-GHz pulse train.

FIG. 3 shows the dependence of gain and facet output power on the average power in the input fiber, for a 12-ps 4-GHz pulse train at a wavelength of 1.242 $\mu$m. A single laser (No. 1), polarized along the amplifier junction plane (TE) was used for this measurement. The measured small-signal gain is 9.5 dB. It decreases by as much as 2 dB for the largest input power of 500 $\mu$W. The maximum average output facet power is 12 mW, corresponding to a pulse peak facet power of 400 mW, and a pulse energy of 3 pJ/pulse.

Figure 2:
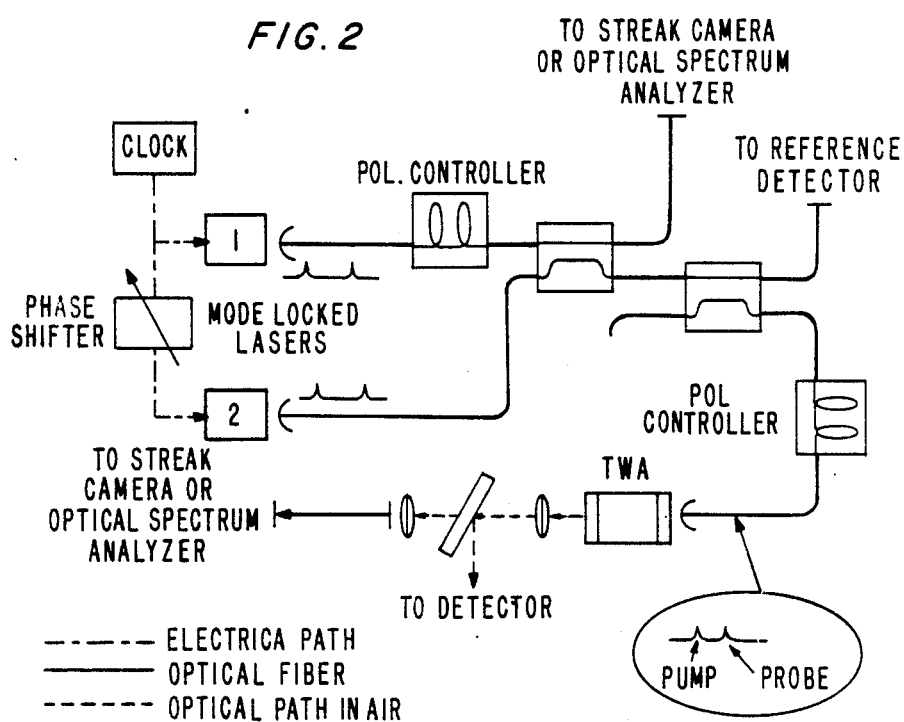
FIG. 2 is a representation of the apparatus used to study gain in optical amplifiers.
Figure 4:
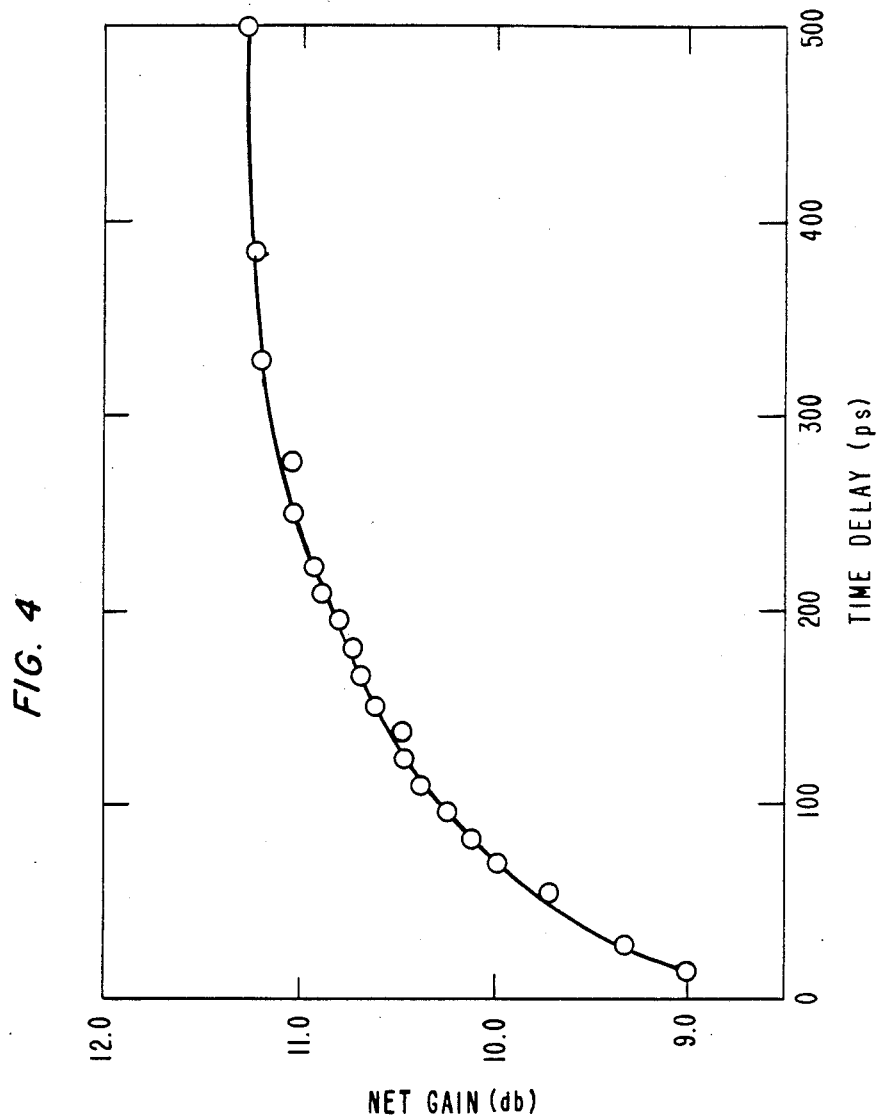
FIG. 4 shows the gain recovery of an optical amplifier following a 93-fJ/pulse pump pulse. The probe pulse energy was 1.8 fJ/pulse as measured in the input fiber.

Gain recovery was measured in a pump-probe experiment using the two lasers shown in FIG. 2. The lasers were operated at a wavelength of 1.25 μm, and at a repetition rate of 1 GHz. Laser No. 1 with 25-ps pulses and an average power of 93 μW (93 fJ/pulse) in the input fiber was the pump. Laser No. 2, with 14-ps pulses and an average power of 1.86 μW (1.86 fJ/pulse), was chopped and served as the probe. FIG. 4 shows the gain experienced by the probe pulse as a function of the delay time between the pump and the probe. The pump pulse depletes the gain by 2 dB at zero time delay. The gain recovers to its original value with a functional form that can be fitted to an exponential with a time constant of 100 ps.

The maximum gain compression observed in this amplifier at both 1 GHz and 4 GHz was 2 dB (FIGS. 4 and 3 respectively). For both repetition rates, the same amount of gain compression (2 dB) was obtained for approximately the same pulse energy, ~100 fJ/pulse at 1 GHz and ~125 fJ/pulse at 4 GHz, measured in the input fiber. (The small difference is assumed to be due to differences in the input coupling loss). This dependence of gain compression on pulse energy, rather than on average input power, is consistent with the short (100 ps) recovery time constant measured for this device (FIG. 4). Since the amplifier gain is essentially recovered after 250 ps, successive pulses at 4-GHz are independent of each other during amplification. No inter-symbol interference is expected therefore, when digital signals at bit rates as high as 4 Gb/s are amplified, even if the energy in each pulse is sufficient to compress the gain. At higher bit rates, the gain, if compressed, will not recover completely between pulses, causing degradation of system performance due to inter-symbol interference.

A conventional model describes the gain dynamics by a rate equation for the carrier density N:

$$\frac{dN(t)}{dt} = \frac{I}{eV} - R(N)$$

where I is the drive current, e the electronic charge, and V the active volume. R(N) represents all the recombination processes. When the input pulse is short, and the time between pulses is long, there is no stimulated emission during the recovery[4] and the recombination R(N) becomes:

$$R(N) = \frac{B_0 N}{\delta}(1 - e^{-\delta N}) + CN^3$$

(A. J. Taylor and J. M. Wiesenfeld, Phys. Rev. B, 35, 2321 (1987)).
The $CN^3$ term in R(N) represent recombination due to the Auger process, while the other terms describe bimolecular recombination. If the pulses are wide, or if a digital input signal is modulated in the non-return to zero format, then the recombination is different due to the addition of stimulated emission during the recovery. The coefficients $B_0$ and $\delta$ are fitting parameters of an analytical approximation to a quantum mechanical calculation of the carrier density dependent radiative recombination rate in InGaAsP (A. J. Taylor and J. M. Wiesenfel, Phys. Rev. B, 35, 2321 (1987), B. Sermage, J. P. Heritage, and N. K. Dutta, J. App. Phys., 57, 5443, (1985)). Their values are $B_0 = 1.4 \times 10^{-10}$ cm$^3$/s and $\delta = 1.8 \times 10^{-19}$ cm$^3$ (A. J. Taylor and J. M. Wiesenfeld, Phys. Rev. B, 35, 2321 (1987)). The Auger coefficient is $C = 2.6 \times 10^{-29}$ cm$^6$/s. Since TW amplifiers can be driven to high currents without reaching lasing threshold, their steady-state carrier density $N_0$ can be much higher than that of a laser (where the carrier density is clamped at threshold due to stimulated emission). At high drive currents, recombination in a TW amplifier is dominated by the Auger process, and $$N = \left(\frac{I}{CeV}\right)^{\frac{1}{3}}.$$

The carrier lifetime for recovery to $N_0$ is $$\tau = \left[\frac{dR(N)}{dN}\right]^{-1}.$$

For an Auger dominated recombination, and for moderate gain compression, so there is only a slight deviation in N from $N_0$, $R(N) = CN^3$, and $$\tau = \frac{1}{3}\left(\frac{eV}{\sqrt{C}}\right)^{\frac{1}{3}} I^{-\frac{1}{3}}.$$

For amplifiers of (250–500) μm length, with active region cross section of conventional buried heterostructures (0.15–0.4) μm$^2$, and for drive currents of (80–120) mA, the carrier density can be as high as ~$5 \times 10^{18}$ cm$^{-3}$. Based on the above model, the calculated carrier lifetime becomes $\tau = 300$–450 ps. This value for the lifetime is significantly longer than the measured lifetime (~100 ps) for an amplifier with the channeled substrate buried heterostructure (CSBH) structure. Further measurements of san amplifier with a CSBH structure, yielding a lifetime of ~80 ps, are described later.

Our new understanding of the physical mechanism which accounts for the short measured lifetime, enables the design of new amplifier structures with short gain recovery times. We introduce the concept of carrier-storage regions (carrier-reservoirs) located in located in close proximity (within a few μm) to the active region. A portion of the amplifier drive current flows through the reservoir regions, rather than through the active region. This current forces the carrier density in the storage region to be driven to values approximately the same as in the active region. The optical input signal is coupled only into the active region. Thus, when an optical pulse with sufficient energy to compress the gain is applied, it depletes the carriers in the active region but not in the carrier-storage region. A gradient of carriers is formed between the regions causing carriers to diffuse from the carrier-storage regions into the active region, thereby reducing the time taken for the carrier density in the active region to recover to its steady state value. For carriers that are stored within 1–2 μm from the active region, the diffusion time is very fast (less than 100 ps), so that this process reduces the carrier recovery time. In some cases, carriers may also flow from the storage region into the active region by drift through high conductivity current paths near the active region. In addition to being shortened, the recovery time becomes bias-independent, in contrast to the $I^{-\frac{2}{3}}$ bias-dependence predicted by the conventional model for Auger-limited recombination.

Figure 5:
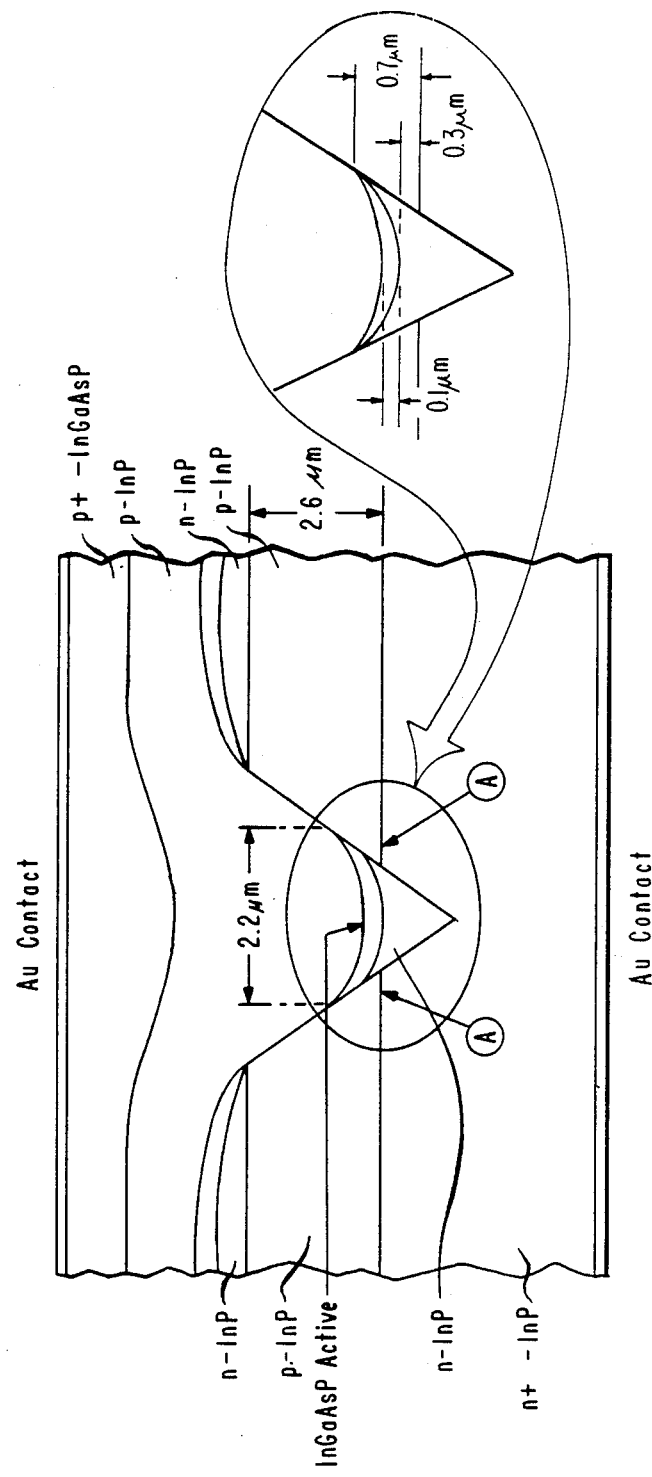
FIG. 5 is a representation of an optical amplifier with a CSBH structure.
Figure 6:
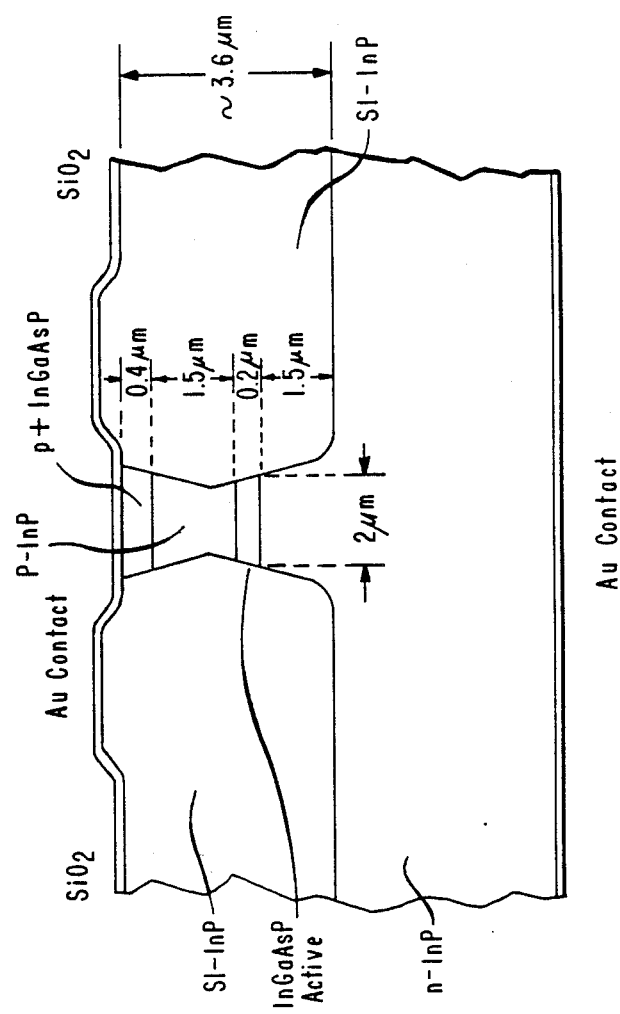
FIG. 6 is a representation of an optical amplifier with a SIEMBH structure.

The concept of enhanced recovery due to diffusion from carrier-storage regions was tested by comparing the recovery time in two nominally 1.3-μm TW amplifiers. The first has a CSBH structure (cross-section shown in FIG. 5). Laser diodes with this structure are known to have a poor modulation response since the pn current bocking junctions constitute parasitic (shunt) capacitances. (R. S. Tucker, IEEE J. Lightwave Tech., LT-3, 1180 (1985)). Such junctions can serves as carrier-storage regions. In particular, regions A in FIG. 5 are carrier-storing forward biased junctions located within a few $\mu$m from the active region. The second amplifier was based on a semi-insulating etched mesa buried heterostructure (SI-EMBH) laser structure. Its cross-section is shown in FIG. 6. Laser diodes with this structure have wide modulation bandwidth due to the semi-insulating InP current blocking regions which provide low parasitic capacitance and minimize the leakage current. In this structure, there are no carrier-storage regions adjacent to the active region and recovery time is expected to be determined by material properties and drive current. Both amplifiers use silicon monoxide anti-reflection coatings (G. Eistein, G. Raybon and L. W. Stulz, IEEE J. Lightwave Tech., LT-6, 12 (1988)) with facet reflectivities of $\sim 10^{-4}$.

Gain-recovery in the two types of amplifiers was measured in pump-probe experiments. Two wavelength-tunsable actively mode-locked semiconductor lasers (Y. L. Bessenov, A. P. Bogatov, P. P. Vasilev, V. N. Morozov and A. B. Sergeev, Sov. J. Quantum Electron, 12, 1510 (1983)) which generate $\sim 15$ ps pulses at a repetition rate of 1 GHz were used. The delay between pulse trains was adjusted by varying the phase of the RF drive signal to one of the lasers. The two signals were combined in a fiber directional coupler and the combined signal was coupled into the amplifier under test, via a fiber pig-tailed isolator, using a microlens. Light was coupled out of the amplifier using a microscope objective lens. The total coupling loss was 10 dB. The pump and probe pulses had energies of $\sim 100$ fJ/pulse and $\sim 2$ fJ/pulse respectively.

Figure 7:
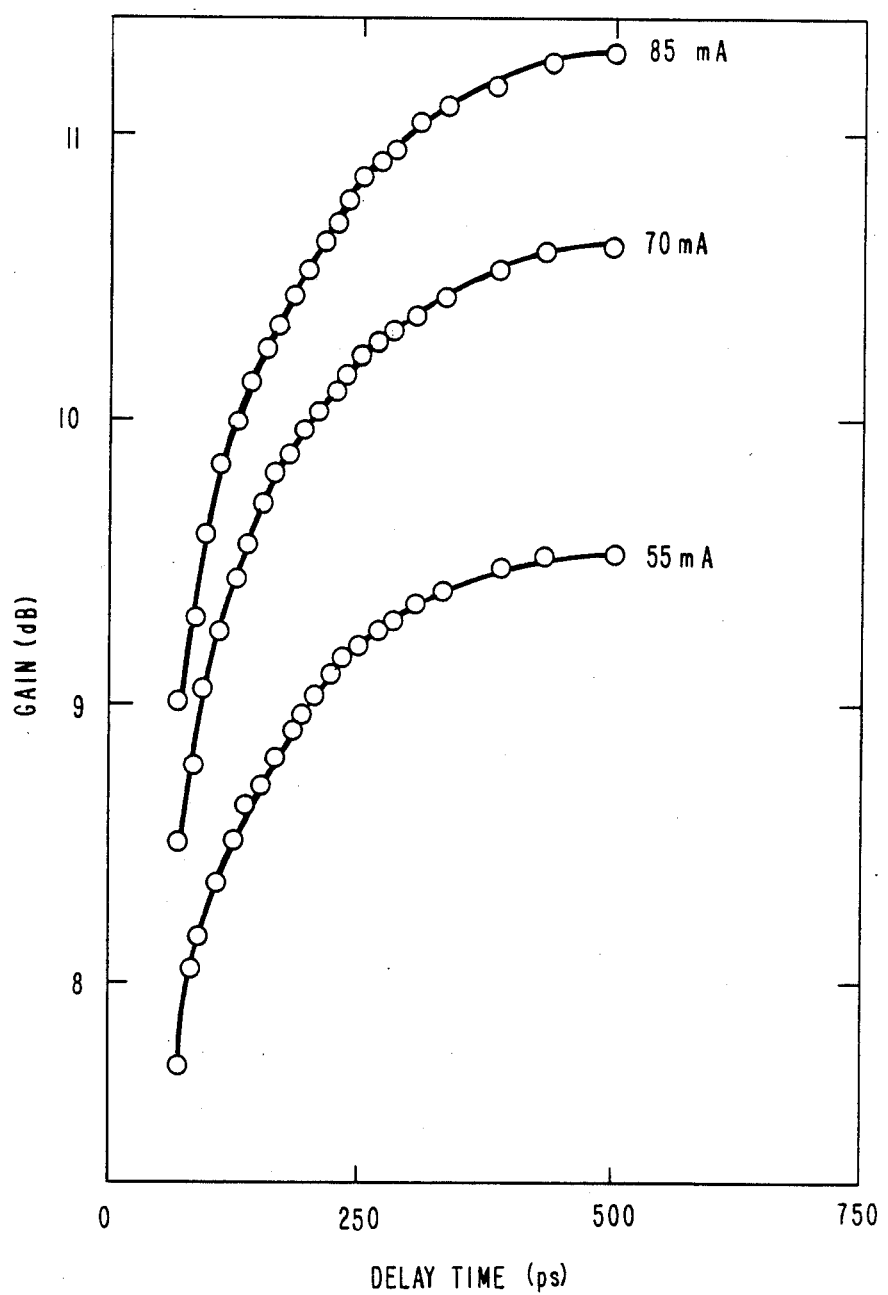
FIG. 7 shows the recovery for the amplifier of FIG. 5.
Figure 8:
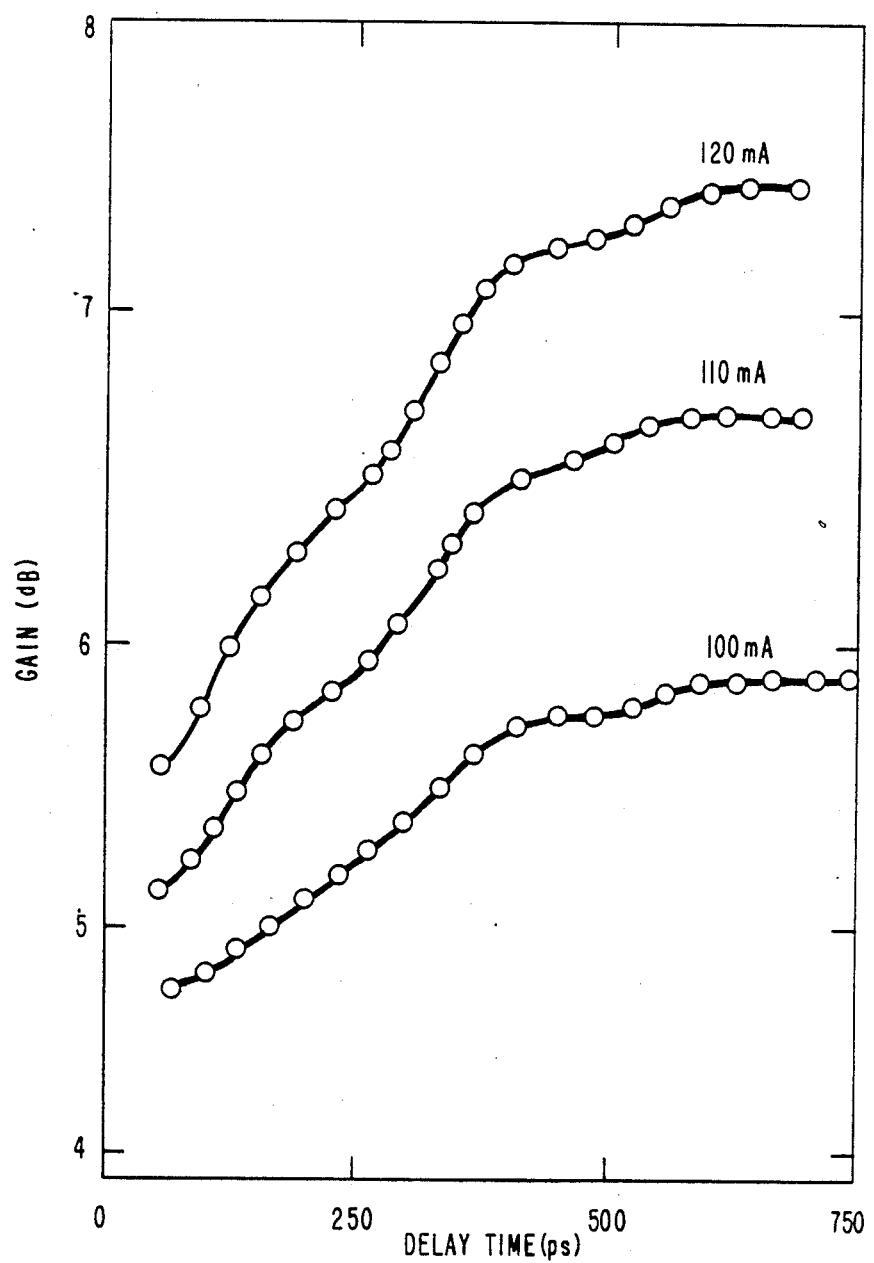
FIG. 8 shows the recovery for the amplifier of FIG. 6.
Figure 9:
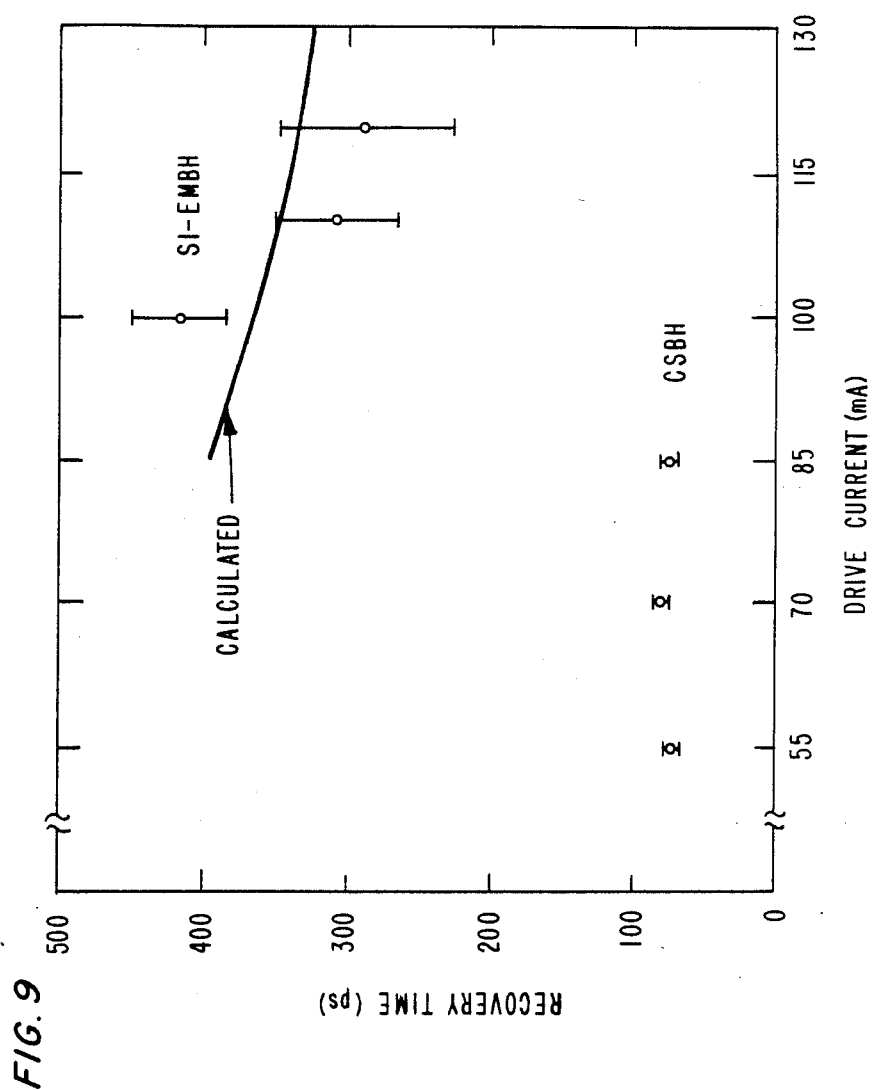
FIG. 9 shows the dependence of the gain recovery time on the amplifier bias for the amplifiers of FIG. 5 and FIG. 6.

FIGS. 7 and 8 show the measured gain recovery for the amplifiers with the CSBH and SI-EMBH structures, respectively, for several drive currents. The pump pulse depletes the gain at zero time delay and the gain starts to recover after the pump pulse disappears. The gain-recovery time is determined for each curve by fitting it to an exponential form. The dependence of the gain-recovery time on the amplifier bias is shown in FIG. 9 for both amplifiers. For the amplifier with the CSBH structure, the recovery time is $80\pm10$ ps and is bias-independent, consistent with a recovery which is dominated by diffusion (or drift) from the carrier-storage regions. The measured recovery time is inconsistent with the conventional Auger-limited rrecombination model. The same recovery time (80 ps) was obtained when the pump pulse energy was reduced to 2 fJ/pulse. The recovery time for the amplifier with the SI-EMBH structure is bias dependent and varies from $420\pm40$ ps at 100 mA to $290\pm60$ ps at 120 mA. This result is consistent with a material (Auger) dominated recovery process as expected in a structure with no carrier-storage regions. A calculated recovery time, obtained using all terms in the expression for R(N), is also plotted in FIG. 9 and shows reasonably good agreement with the measured data.

Our work demonstrates the use of carrier diffusion from carrier-storage regions to shorten the gain recovery time of semiconductor optical amplifiers. To obtain a short gain recovery time, amplifiers should be made of structures which have built in carrier-storage regions near the active region. It is interesting to note that lasers with this type of structure generally have poor modulation response due to parasitic shunt capacitance (R. S. Tucker, IEEE J. Lightwave Tech., LT-3, 1180 (1985)) associated with the storage regions located near the active region. Specially designed structures with properly placed carrier-storage regions could be used to further reduce the recovery time. Short recovery time will enhance the performance of amplifiers used in high bit-rate systems and in a bistable mode.

III. ALTERNATIVE EMBODIMENTS OF THE INVENTION

As discussed in section 1, the inventive device involves semiconductor optical amplifiers of communications systems using such amplifiers, where the amplifier includes a "carrier-storage" region and a "gain" or "active" region, juxtaposed sufficiently close to each other so that the time for the carriers to move from the storage region to the gain region is less than or equal to the intrinsic lifetime of the carriers in the gain region. In this section, various alternative embodiments of the invention are described all of which fall within this broad generic description of the invention.

In FIG. 10, an embodiment of the inventive amplifier is shown which involves a buried ridge waveguide. In the figure, 51 is an appropriate contact usually metallic. "Bias" current flows from layer 51 to layer 56, the substrate. Confinement of the current is effected by regions 58 which may be either air gap regions or regions of material which substantially block current flow. Such materials may either be insulators of appropriately biased semiconductors. Item 55 is a layer of gain material either undoped or lightly dopen n. The thickness of the material will vary depending upon the specific embodiment and the material of layer 55 will depend upon the wavelength of light which one desires to amplify. In a particular embodiment 55 may be InGaAsP. For such an embodiment layer 53, which is doped p, may be InP. Layer 52 is a contacting layer and may be InGaAsP or InGaAs doped p+. Layer 54 is InP doped p.

In FIG. 10, region 57 is a ridge waveguide well known in the art. Regions 55 and 57 are regions of different bandgap. For example, region 55 may be 1.3 micron material and region 57 may be 1.1 micron material, or region 55 may be 1.5 micron material and region 57 may be 1.3 micron material. As is well known in the art the ridge waveguide region 57, acts a "loading" region for the active region 55. This effect of the ridge waveguide is to confine, to a region substantially below the ridge waveguide, light traveling in layer 55 in a direction perpendicular to the plane of the diagram.

It is interesting to note that in this embodiment both the storage regions and the gain region occur in the same layer of material 55. The gain region is that region which lies substantially below the ridge waveguide, because that is the only region through which the light travels. The remaining portions of layer 55 are storage regions because the bias current in traveling from layer 51 to layer 56 traverses substantially all parts of layer 55. In this embodiment part of the current flow passes through the storage region and another part of the current flow passes through the gain region. In such embodiments the optical radiation will often be confined to a region, whose length in the direction of the propagation of light is substantially equal to the length of the gain region in that direction, and which substantially coincides with the gain region. The surface area of the region perpendicular to the flow of the current is less than that of the region to which the total current is confined. (Note that beyond the defined region the light may or may not be confined. This definition is presented merely to focus attention on this particular region.) Other embodiments, however, may involve vertically juxtaposed gain and storage regions when viewed from the perspective of the current flow, and accordingly substantiall portions of the current will flow through both the gain and storage regions. In such vertical embodiments, the optical radiation will often be confined to a region, whose length in the direction of the propagation of light is substantially equal to the length of the gain region in that direction, and which substantially coincides with the gain region. However, in this "vertical" embodiment, the surface area of this region perpendicular to the flow of current is approximately equal to the concomitant surface area associated with the current flow. In this embodiment as in other embodiments the particular characteristics of the gain region or the storage region may vary and may include, for example, multiple layers of material some of which are commonly called multiple quantum wells. Additionally, it will be clear that a single storage region may suffice for the purposes of this invention.

Figure 11:
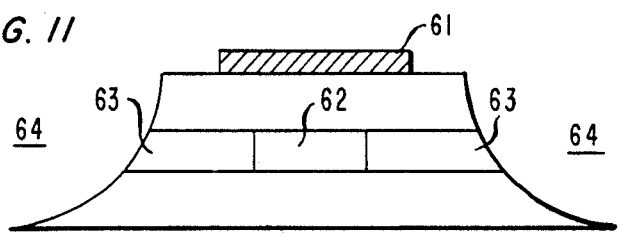
FIG. 11 is an alternative embodiment of the invention in which the optical radiation is confined to the active or gain region by appropriate selection of index of refraction for the materials adjoining the active region.

In FIG. 11, layer 61 is a metallic contact. Region 62 is the gain region and region 63 is the storage region. In this embodiment the index of refraction of region 62 is different from that of region 63 resulting in confinement of the optical radiation to region 62. Current may be confined to the active and charge storage regions by regrown semi-insulating material, or an appropriate air gap, either of which is shown in the figure as 64.

Figure 12:
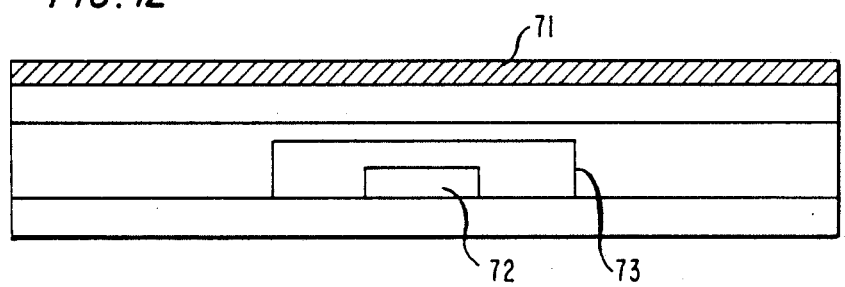
FIG. 12 is an alternative embodiment in which index variations are gain used to confine the optical radiation to the active or gain region.

FIG. 12 is an alternative embodiment in which 71 is a metallic contact. In this embodiment, 72, the active or gain region, has an index of refraction different that that of 73 which includes the charge storage region.

Figure 13:
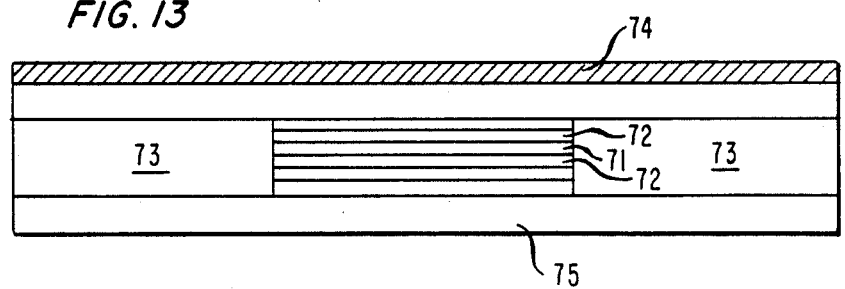
FIG. 13 is an embodiment of the invention involving vertically juxtaposed gain and storage regions.

FIG. 13 is an embodiment of the invention involving vertically juxtaposed gain and storage regions. In this figure, 71 is the gain region and 72 are the storage regions. 73 are appropriate current blocking regions, 74 is a metallic contact and 75 is a substrate. As discussed above, in such "vertically juxtaposed" devices, the optical radiation is confined to a region whose surface area perpendicular to the flow of current is approximately equal to the concomitant surface area associated with the current flow.

We claim:

1. An optical communications system comprising
   (a) a semiconductor optical amplifier comprising
      (1) a gain region, and
      (2) means for confining an optical field, propagating in the gain region, in a direction transverse to the direction of propagation, and to a degree greater than that resulting from diffraction,
   (b) an optical data bit stream
   (c) means for coupling the optical data bit stream into the optical amplifier
   (d) means for detecting the amplified optical data bit stream emitted by the optical amplifier,
   THE INVENTION CHARACTERIZED IN THAT
   (a) the optical amplifier further comprises a carrier-storage region, the mean time for carriers to move from the carrier-storage region to the gain region being less than or equal to the intrinsic lifetime of the carriers in the gain region, and
   (b) the data bit rate associated with the optical data bit stream is greater than 1 GHz.

2. The system of claim 1 wherein the optical field is not guided in the carrier-storage.

3. The system of claim 1 wherein the optical radiation is confined to a region, whose length in the direction of the propagation of light is substantially equal to the length of the gain region in that direction, and which substantially coincides with the gain region, and whose surface area perpendicular to the flow of a carrier injecting current is less than the surface area, perpendicular to the flow of the carrier injecting current, of the region to which the total carrier injecting current is confined.

4. The system of claim 1 wherein the optical radiation is confined to a region, whose length in the direction of the propagation of light is substantially equal to the length of the gain region in that direction, and which substantially coincides with the gain region, and whose surface area perpendicular to the flow of a carrier injecting current is substantially equal to, or greater than, the surface area, perpendicular to the flow of the carrier injecting current, of the region to which the total carrier injecting current is confined.

* * * * *